United States Patent
Heo et al.

(10) Patent No.: US 12,336,370 B2
(45) Date of Patent: Jun. 17, 2025

(54) LIGHT-EMITTING DIODE AND METHOD FOR PRODUCING SAME

(71) Applicants: KYUNGPOOK NATIONAL UNIVERSITY INDUSTRY-ACADEMIC COOPERATION FOUNDATION, Daegu (KR); SEOUL NATIONAL UNIVERSITY R&DB FOUNDATION, Seoul (KR)

(72) Inventors: Young Woo Heo, Daegu (KR); Hyeok Kim, Seoul (KR); Joon Hyung Lee, Daegu (KR); Jeong Joo Kim, Daegu (KR); Sang Wook Lee, Daegu (KR); Jeong Woo Han, Gyeongsangbuk-do (KR); Sang Hyub Kim, Seoul (KR); Chang Hee Lee, Seoul (KR)

(73) Assignees: KYUNGPOOK NATIONAL UNIVERSITY INDUSTRY-ACADEMIC COOPERATION FOUNDATION, Daegu (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 503 days.

(21) Appl. No.: 17/618,392

(22) PCT Filed: Jun. 10, 2020

(86) PCT No.: PCT/KR2020/007535
§ 371 (c)(1),
(2) Date: Dec. 10, 2021

(87) PCT Pub. No.: WO2020/251262
PCT Pub. Date: Dec. 17, 2020

(65) Prior Publication Data
US 2022/0278297 A1    Sep. 1, 2022

(30) Foreign Application Priority Data

Jun. 11, 2019 (KR) .................. 10-2019-0068913

(51) Int. Cl.
H10K 50/16 (2023.01)
H10K 59/38 (2023.01)
H10K 71/00 (2023.01)
H10K 102/10 (2023.01)

(52) U.S. Cl.
CPC .......... *H10K 50/167* (2023.02); *H10K 59/38* (2023.02); *H10K 71/00* (2023.02); *H10K 2102/102* (2023.02); *H10K 2102/103* (2023.02)

(58) Field of Classification Search
CPC ................. H10K 50/115; H10K 50/16–167
See application file for complete search history.

(56) References Cited

U.S. PATENT DOCUMENTS

2011/0140075 A1* 6/2011 Zhou .............. H10K 59/131
977/774
2017/0186984 A1 6/2017 Hosono et al.

FOREIGN PATENT DOCUMENTS

CN          110291386 A  *  9/2019 ............ C23C 14/34
KR       10-2006-0101184       9/2006
(Continued)

OTHER PUBLICATIONS

English Translation on CN 110291386A. Date of Translation: Apr. 19, 2024 (Year: 2024).*
(Continued)

*Primary Examiner* — Amar Movva
(74) *Attorney, Agent, or Firm* — PROCOPIO, CORY, HARGREAVES & SAVITCH LLP (57) ABSTRACT

A quantum dot light emitting diode according to various embodiments of the present disclosure includes a first electrode and a second electrode that are opposite to each other;
(Continued)

a light emitting layer that is located between the first electrode and the second electrode and includes a quantum dot; and an electron transport layer that is arranged between the first electrode and the light emitting layer and includes a metal oxide thin film, wherein the metal oxide thin film has a composition including at least one selected from the group consisting of $In_2O_3$, $ZnO$, $SiO_2$ and $SnO_2$.

8 Claims, 3 Drawing Sheets

(56) References Cited

FOREIGN PATENT DOCUMENTS

| KR | 10-2017-0059996 | 5/2017 |
|---|---|---|
| KR | 10-2017-0102401 | 9/2017 |
| KR | 10-2017-0121271 | 11/2017 |
| KR | 10-2019-0015672 | 2/2019 |
| WO | 2018/120510 A1 | 7/2018 |

OTHER PUBLICATIONS

Patent Cooperation Treaty, International Search Report, Application No. PCT/KR2020/007535, dated Sep. 17, 2019, in 4 pages.
Kim et al., "Effects of Oxide Electron Transport Layer on Quantum Dots Light Emitting Diode with an Organic/Inorganic Hybrid Structure", Electron. Mater, Lett., vol. 9, No. 6 (2013), pp. 779-782.
European Patent Office, Extended European Search Report, Application No. 20822015.2, dated Jan. 17, 2023, in 8 pages.

* cited by examiner

LIGHT-EMITTING DIODE AND METHOD FOR PRODUCING SAME

TECHNICAL FIELD

Various embodiments of the present invention relate to a light emitting diode and a method for producing the same.

BACKGROUND ART

Quantum dots are colloidal semiconductor crystals, which have a size of several nanometers to several tens of nanometers, and have high color purity, color reproducibility, and photostability, and thus are spotlighted as a next-generation light emitting material. By adjusting the particle size of the semiconductor crystal, a wide range of emission wavelengths can be adjusted and the solution process can be applied, whereby there is an advantage that the manufacturing process is simple. For this reason, a quantum dot light emitting diode (QLED) using quantum dots as a light emitting material is being actively studied as a next-generation device.

A typical quantum dot light emitting diode has an anode electrode, a cathode electrode, and a quantum dot light emitting layer arranged between these electrodes. When a voltage is applied between the electrodes, electrons are injected into the quantum dot light emitting layer from the cathode electrode, and holes are injected into the quantum dot light emitting layer from the anode electrode. A binding energy is generated when holes and electrons are recombined in the quantum dot light emitting layer.

In general, a metal oxide thin film is used as an electron transport layer in a quantum dot light emitting diode. In one example, a solution type ZnO layer (e.g., a nanoparticle layer or a sol-gel thin film layer) is used as the metal oxide thin film. However, the solution type ZnO layer has a rough surface, which is disadvantageous for uniform light emitting characteristics. Further, such solution type ZnO layer is a major factor of causing an exciton quenching by ligand & dangling-bond of quantum dots, which are inorganic semiconductors.

Therefore, there is a demand for a electron transport layer based on a vacuum deposition that can overcome the limitations to the use of a solution type ZnO layer.

DETAILED DESCRIPTION OF THE INVENTION

Technical Problem

Various embodiments of the present invention provide a light emitting diode including an electron transport layer formed by a sputtering method, and a method for producing the same.

Various embodiments of the present invention can overcome the limitations of existing solution type ZnO layers.

Technical Solution

According to various embodiments of the present invention, there is provided a light emitting diode comprising: a first electrode and a second electrode that are opposite to each other; a light emitting layer that is located between the first electrode and the second electrode and includes a quantum dot; and an electron transport layer that is arranged between the first electrode and the light emitting layer and includes a metal oxide thin film, wherein the metal oxide thin film has a composition including at least one selected from the group consisting of $In_2O_3$, ZnO, $SiO_2$ and $SnO_2$.

Advantageous Effects

According to the present invention, an electrode and an electron transport layer can be manufactured through a sputtering method, and a continuous vapor deposition process can be introduced.

According to the present invention, an electrode and an electron transport layer can be formed by a vacuum deposition at a low temperature, and thus can be easily applied to a flexible device.

According to the present invention, a quantum dot light emitting diode having excellent uniformity, reproducibility and stability can be produced in a large quantity.

According to the present invention, it is easier to adjust the electron density, electron mobility, electrical conductivity and work function than a solution type ZnO layer, which is a conventional electron transport layer, thereby increasing the efficiency of the quantum dot light emitting layer.

According to the present invention, it has an effect of reducing the occurrence of exciton quenching due to a dangling bond between the quantum dot and the electron transport layer.

DETAILED DESCRIPTION OF THE EMBODIMENTS

Hereinafter, various embodiments of the present document will be described with reference to the accompanying drawings. Embodiments and terms used therein are not intended to limit the technology described in this document to specific embodiments, and should be understood to cover various modifications, equivalents, and/or substitutions of the embodiments.

Below, the embodiments of the present invention will be described in detail with reference to the accompanying drawings.

Figure 1:
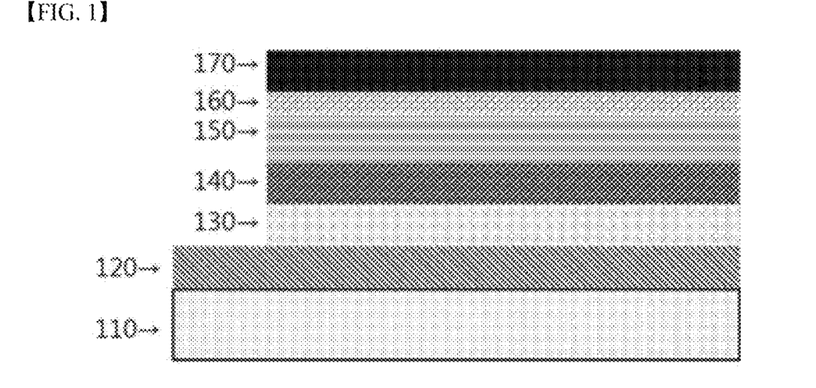
FIG. 1 is a cross-sectional view of a quantum dot light emitting diode according to one embodiment of the present invention.

FIG. 1 is a cross-sectional view of a quantum dot light emitting diode according to one embodiment of the present invention.

Referring to FIG. 1, a quantum dot light emitting diode according to one embodiment of the present invention may include a substrate 110, a first electrode 120 and a second electrode 170 that are arranged opposite to each other, a quantum dot light emitting layer 140 that is arranged between the first electrode 120 and the second electrode 170, and an electron transport layer 130 and hole transport layers 150 and 160 that are arranged opposite to each other with respect to the quantum dot light emitting layer 140.

On the other hand, the electron transport layer 130 may have a monolayer structure composed of an electron injection/transport layer or a bilayer structure composed of an electron injection layer and an electron transport layer. Similarly, the hole transport layers 150 and 160 may have a monolayer structure composed of a hole injection/transport layer or a bilayer structure composed of a hole injection layer and a hole transport layer.

The substrate 110 supports each layer constituting the quantum dot light emitting diode on the upper portion. The substrate 110 may be composed of a transparent material such as glass, quartz, plastic, or organic-inorganic composite polymer having a first refractive index of about 1.4 to about 1.9. For example, the substrate 110 may be a glass substrate, and may include borosilicate glass. In another example, the substrate 110 may be a flexible substrate, and examples thereof may include polyethylene terephthalate (PET), polyethylene naphthalate (PEN), polyethylene (PE), polyethersulfone (PES), polycarbonate (PC), polyarylate (PAR) or polyimide (PI). Further, a substrate buffer layer may be arranged on the substrate 110, but may be omitted depending on the type of substrate and process conditions. The substrate buffer layer may be formed of various materials capable of performing the function of flattening a surface while preventing penetration of impurity elements. For example, any one of a silicon nitride ($SiN_x$) film, a silicon oxide ($SiO_y$) film, and a silicon oxynitride ($SiOxN_y$) film may be used as the substrate buffer layer.

The first electrode 120 may be an anode electrode, and the second electrode 170 may be a cathode electrode, but conversely, the first electrode 120 may be a cathode electrode and the second electrode 170 may be an anode electrode. The first electrode 120 and the second electrode 170 may be formed of a transparent conductive material, respectively, or alternatively may be formed of a semi-transmissive or reflective conductive material.

For example, the first electrode 120 and the second electrode 170 may include indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO—Ag—IZO), indium zinc tin oxide-silver-indium zinc tin oxide (IZTO-Ag-IZTO), aluminum zinc oxide-silver-aluminum zinc oxide (AZO-Ag-AZO), GZO (ZnO—$Ga_2O_3$: zinc oxide doped with gallium), Nb-doped $TiO_2$, Ta-doped $TiO_2$, and IWZO ($In_2O_3$—$WO_3$—ZnO: indium oxide doped with tungsten trioxide and zinc oxide), antimony oxide ($Sb_2O_3$), zirconium oxide ($ZrO_2$), tin oxide ($SnO_2$), and the like, respectively.

Alternatively, these may include aluminum (Al), gold (Au), silver (Ag), tin (Sn), carbon (C), iron (Fe), cobalt (Co), nickel (Ni), zinc (Zn), tungsten (W), vanadium (V), copper (Cu), iridium (Ir), molybdenum (Mo), palladium (Pd), platinum (Pt), lithium fluoride and aluminum laminate (LiF/Al), calcium and aluminum laminate (Ca/Al) or calcium and silver laminate (Ca/Ag), and the like.

Depending on the type of material that forms the first electrode 120 and the second electrode 170, the light emitting form may provide a top emission, a bottom emission, or a double-sided emission. When the first electrode 120 is an anode, it may include a material selected from materials having a high work function so as to facilitate hole injection.

The thickness of the first electrode 120 and the second electrode 170 may be 50 nm to 150 nm. When a metal material is used as the transparent electrode, the thickness of the first electrode 120 and the second electrode 170 is preferably in the range of 2 nm to 50 nm.

The light emitting layer 140 may be arranged between the first electrode 120 and the second electrode 170. The light emitting layer 140 may include a quantum dot. The light emitting layer 140 may include, for example, one or more selected from the group consisting of a red quantum dot having a wavelength of 570 nm to 780 nm in the light emitting region; a green quantum dot having a wavelength of 480 nm to 570 nm in the light emitting region, and a blue quantum dot having a wavelength of 380 to 480 nm in the light emitting region.

The quantum dot may include a group II-VI compound, a group III-V compound, a group IV-VI compound, a group IV compound, and combinations thereof. The group II-VI compound may be selected from the group consisting of a binary compound selected from the group consisting of CdSe, CdTe, ZnS, ZnSe, ZnTe, ZnO, HgS, HgSe, HgTe, MgSe, MgS and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from the group consisting of a binary compound selected from the group consisting of GaN, GaP, GaAs, GaSb, AlN, AlP, AlAs, AlSb, InN, InP, InAs, InSb and mixtures thereof; a ternary compound selected from the group consisting of GaNP, GaNAs, GaNSb, GaPAs, GaNSb, AlNP, AlNAs, AlNSb, AlPAs, AlNSb, InNP, InNAs, InNSb, InPAs, InPSb, GaAlNP and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group III-V compound may be selected from the group consisting of a binary compound selected from the group consisting of GaN, GaP, GaAs, GaSb, AlN, AlP, AlAs, AlSb, InN, InP, InAs, InSb and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP InSb and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from the group consisting of a binary compound selected from the group consisting of SnS, SnSe, SnTe, PbS, PbSe, PbTe and mixtures thereof; a ternary compound selected from the group consisting of SnSeS, SnSeTe, SnSTe, PbSeS, PbSeTe, PbSTe, SnPbS, SnPbSe, SnPbTe and mixtures thereof; and a quaternary compound selected from the group consisting of SnPbSSe, SnPbSeTe, SnPbSTe and mixtures thereof.

The group IV element may be selected from the group consisting of Si, Ge, and mixtures thereof; and the group IV compound may be a binary compound selected from the group consisting of SiC, SiGe, and mixtures thereof. In addition, group II oxides; group III oxides; group VI oxides; group V oxides; group VI oxides can be included.

The average particle diameter of the core among the core/shell quantum dots may be 2 nm to 5 nm. On the other hand, the average thickness of the shell may be 3 nm to 5 nm. Further, the average particle diameter of the quantum dots may be 5 nm to 10 nm. When the core, shell and quantum dot satisfy the average particle diameter or average thickness range as described above, not only it can behave like a quantum dot, but also it can have excellent dispersibility. By variously selecting the particle diameter of the core, the average thickness of the shell, and the average particle diameter of the quantum dot within the range as described above, the emission color of the quantum dot and/or the semiconductor characteristics of the quantum dot can be variously changed. The form of the quantum dot is not particularly limited to those generally used in the art, but more specifically, it is preferable to use the form of spherical, pyramidal, multi-arm, or cubic nanoparticles, nanotubes, nanowires, nanofibers, nanoplate particles, and the like. In addition, the quantum dot may further include a ligand that is formed on the surface of the shell and chemically bound. The ligand may include an organic functional group, and the organic functional group may include, for example, oleate, trioctylphosphine, dendrimers, and the like.

On the other hand, the hole transport layer 150 and the hole injection layer 160 can be arranged on the light emitting layer 140. The hole injection layer 160 can play a role in improving the injection of holes from the electrode 170 into the hole transport layer 150. The hole injection layer 160 can play a role in improving the injection of holes from the electrode 170 into the hole transport layer 150. The hole injection layer 160 can be formed of materials such as CBP (4,4'-Bis(N-carbazolyl)-1,1'-biphenyl), TCTA (Tris(4-carbazoyl-9-yl phenyl)amine), PVK (Poly(9-vinylcarbazole)), TFB (poly(9,9-dioctylfluorene-co-N-(4-butylphenyl)diphenylamine)), CuPc (copper phthalocyanine), PEDOT (poly (3,4)-ethylenedioxythiophene), PANI (polyaniline), NPD (N,N-dinaphthyl-N,N'-diphenyl benzidine) or the like, but is not limited thereto.

The hole transport layer 150 can be arranged so as to be laminated on the hole injection layer 160. The hole transport layer 150 can perform the function of smoothly transporting holes transmitted from the hole injection layer 160. The hole transport layer 150 may include HAT-CN (hexaazatriphenylene hexacarbonitrile), molybdenum oxide ($MoO_3$), tungsten oxide ($WO_3$), vanadium pentoxide ($V_2O_5$), NPD (N,N-dinaphthyl-N,N'-diphenyl benzidine). (N,N'-bis-(3-methylphenyl)-N,N'-bis(phenyl)-benzidine), s-TAD, MTDATA (4,4',4''-tris(N-3-methylphenyl-Nphenyl))-amino)-triphenylamine), TCTA (4-(9H-carbazol-9-yl)-N,N-bis[4-(9H-carbazol-9-yl)phenyl]-benzidine), CBP (4,4'-N, N'-dicarbazole-biphenyl), and the like, but is not limited thereto.

In the present invention, it has been described as forming a structure in which the hole injection layer 160 and the hole transport layer 150 are laminated, but the present invention is not limited thereto. The hole injection layer 160 and the hole transport layer 150 may be formed as a single layer.

An electron transport layer 130 may be arranged between the first electrode 120 and the emission layer 140. The electron transport layer 130 according to the present invention may include a metal oxide thin film. At this time, the electron transport layer 130 may have a composition including at least one selected from the group consisting of $In_2O_3$, ZnO, $SiO_2$ and $SnO_2$. The electron transport layer 130 may be amorphous, crystalline, or a mixed phase of amorphous and crystalline. Specifically, the electron transport layer 130 may include at least one composition selected from the group consisting of $In_2O_3$—ZnO—$SiO_2$ (In—Zn—Si—O) system, $In_2O_3$—ZnO(In—Zn—O) system, ZnO—$SiO_2$ (Zn—Si—O) system, $In_2O_3$—$SiO_2$ (In—Si—O) system, $In_2O_3$—$SnO_2$—$SiO_2$ (In—Sn—Si—O) system, $In_2O_3$—$SaO_2$ (In—Sn—O) system, $SnO_2$—$SiO_2$ (Sn—Si—O) system, ZnO—$SnO_2$—$SiO_2$ (Zn—Sn—Si—O) system, and ZnO—$SaO_2$ (Zn—Si—O) system. Preferably, the electron transport layer 130 may be a thin film composed of In—Zn—Si—O (IZSO), In—Sn—Si—O (ITSO), or Zn—Sn—Si—O (ZTSO).

Specifically, the metal oxide thin film of the electron transport layer 130 may have a composition represented by the following chemical formula 1.

$$_{(1-y)}[_{(1-x)}(In_2O_3)-_x ZnO]-_y SiO_2 \quad \text{[Chemical Formula 1]}$$

wherein, in chemical formula 1, $0 \le x \le 1$ and $0 \le y < 1$. Preferably, $0 \le x < 1$, and $0 \le y \le 0.6$.

Alternatively, the metal oxide thin film of the electron transport layer 130 may have the composition of the following chemical formula 2.

$$_{(1-y)}[_{(1-x)}(In_2O_3)-_x SnO_2]-_y SiO_2 \quad \text{[Chemical Formula 2]}$$

wherein, in chemical formula 2, $0 \le x \le 1$ and $0 \le y < 1$. Preferably, $0 \le x < 1$, and $0 \le y \le 0.6$.

Alternatively, the metal oxide thin film of the electron transport layer 130 may have the composition of the following chemical formula 3.

$$_{(1-y)}[_{1-x}(ZnO)-_x SnO_2]-_y SiO_2 \quad \text{[Chemical Formula 3]}$$

wherein, in chemical formula 3, $0 \le x \le 1$ and $0 \le y < 1$. Preferably, $0 \le x < 1$, and $0 \le y \le 0.6$.

On the other hand, the thickness of such an electron transport layer 130 can be 10 nm to 100 nm.

The electron transport layer 130 may be formed by a sputtering method.

On the other hand, in the present invention, the light emitting layer 140 is prepared as a QLED including quantum dots, but the embodiment is not limited thereto. It can be applied to OLED, printing OLED, printing QLED, flexible OLED, flexible QLED, and the like.

Below, a method of manufacturing the quantum dot light emitting diode including the electron transport layer 130 will be described in more detail.

First, the first electrode 120 may be formed on the substrate 110 by a sputtering method.

Next, the electron transport layer 130 may be formed on the first electrode 120 by a sputtering method. That is, both the first electrode 120 and the electron transport layer 130 may be formed by a continuous vapor deposition process through a sputtering method.

In the step of forming the electron transport layer 130, it can be carried out by a sputtering method using an In—Zn—O target and a $SiO_2$ target. Alternatively, it can be carried out by the sputtering method using an In—Sn—O target and a $SiO_2$ target. Alternatively, it can be carried out by a sputtering method using a Zn—Sn—O target and a $SiO_2$ target.

In the present invention, by separately using the $SiO_2$ target, the composition ratio of $SiO_2$ included in the metal oxide thin film of the electron transport layer 130 can be easily adjusted. The electrical conductivity of the electron transport layer 130 may be adjusted by adjusting the $SiO_2$ content. In addition, the work function, electron affinity, energy band gap (Eg), Fermi level, and the like can be adjusted by adjusting the $SiO_2$ content. Here, adjusting electron affinity means adjusting the conduction band minimum (CBM) level.

However, the embodiment is not limited thereto, and it may be carried out by a single target sputtering method using any one target selected from the group consisting of an In—Zn—Si—O target, an In—Sn—Si—O target, and a Zn—Sn—Si—O target.

In this case, the temperature of the sputtering process may be room temperature to 400° C. According to the present invention, the electron transport layer 130 may be sufficiently formed even through a sputtering process at room temperature. Therefore, an electrode and an electron transport layer can be easily formed on a flexible substrate that is vulnerable to heat, and a flexible quantum dot light emitting diode can be provided.

In addition, the sputtering process may be carried out under Ar and $O_2$ atmospheres. At this time, Ar:$O_2$ may be adjusted to 100:1 to 1000:1. The battery conductivity of the electron transport layer 130 can also be adjusted by adjusting such oxygen partial pressure. That is, the mobility, carrier concentration, and Fermi level can be adjusted by adjusting the oxygen partial pressure.

In the case of a quantum dot light emitting diode, in the light emitting layer 140, the n-type has a stronger characteristic than the p-type, and the charge transport characteristic of the electron transport layer does not need to be excessively excellent. Therefore, in order to reduce the interfacial exciton quenching, it is necessary to adjust the electrical conductivity (conductivity=mobility*carrier concentration) of the electron transport layer 130 to be small.

According to the present invention, the electron density, electron mobility, electrical conductivity and work function can be easily adjusted as compared with the solution type ZnO layer which is a conventional electron transport layer, so that the efficiency of the quantum dot light emitting layer can be improved. In addition, the uniformity, reproducibility, and stability of the electron transport layer can be enhanced compared to a conventional solution process. Further, since the electron transport layer can be formed by a low temperature process, it is applicable to printing OLED, QLED, flexible OLED, flexible QLED, and the like using Soluble.

Further, according to the present invention, it has an effect of reducing exciton quenching due to the dangling bond between the quantum dot and the electron transport layer. In the case of an electron transport layer using conventional solution type ZnO or ZnO nanopowder, the surface of the electron transport layer is relatively rough and there is a difference in the size of the contact interface with the quantum dots. However, the metal oxide thin film according to the present invention has an effect of reducing the contact surface area, and based on this, it has an effect of reducing exciton quenching.

Hereinafter, the present invention will be described in more detail with reference to the following examples. However, these examples are only for illustrating the present invention, and the present invention is not limited thereto.

EXAMPLE

An RF-magnetron sputtering device was used, and an In—Zn—O target and/or an In—Sn—O target having a diameter of 2 inches, and a SiO2 target were used. The position of the gun was designed so as to be adjustable according to the process, and the distance between the target and the substrate was designed to be adjustable according to the mean free path of the target. In order to produce a uniform film, the substrate holder was designed in a structure that can adjust a rotational speed.

Further, in order not to affect the board during pre-sputtering, it was double-designed with a gun shutter and a main shutter. The chamber was composed of a main chamber where sputtering process was carried out and an auxiliary chamber for easily mounting the specimen.

The highest achieved vacuum degree of the device was $3 \times 10^{-7}$ Torr, and the high vacuum was measured using an ion gauge. Further, according to the process pressure, a Pirani gauge and a Hot Cathode gauge were used. The exhaust system used a rotary pump with a capacity of 550 L/min and 150 L/min, and a Turbo Molecular Pump (TMP) with an exhaust capacity of 850 L/min. Magnet used a circular permanent magnet of 10000 Gauss. A magnetic field was formed by the N and S poles of the central magnet and the outer magnet, and the uniformity of the thin film was maintained.

The power supply used a high frequency of 13.56 MHz, enabling it to output power up to 300 W. The used matching box minimized the reflected waves generated from sputtering, thereby enable transmission of a constant frequency.

In the sputtering process using plasma, a large amount of energy is generally transferred to the target during the vapor deposition process, and the target temperature rises. When the temperature rises, it causes deterioration of the magnet, and particles with high energy collide with the thin film to cause damage, and the life of the sputter is shortened. In order to solve these problems, a water-cooled cooling device was constructed under the holder in the present experiment.

The flow rate of the reaction gas used MFC (Mass Flow Controller, Mounting a type 2179 MFC), and as the reaction gas, Ar (99.99%), O2 (99.99%), and a mixed gas of Ar and $O_2$ (Ar:O2=1000:1, 99.99%) were used. The film formation temperature (that is, the substrate temperature) is room temperature.

Through the sputtering process under these process conditions, it was succeeded in forming an electron transport layer containing metal oxide thin film having a composition of $_{(1-y)}[_{(1-x)}(In_2O_3)-_xZnO]-_ySiO_2$ where x=0.75, and y=15.54, Experimental Example 1

Measurement of Electron Transport Layer Characteristics by IZSO Composition

In order to compare the characteristics of each IZSO composition according to the $SiO_2$ content in IZSO (In—Zn—Si—O), co-sputtering was carried out using an In—Zn—O target and a $SiO_2$ target. First, it was set to oxygen partial pressure ($O_2$/(Ar+$O_2$))=0.001%, working pressure=10 mTorr, Substrate Temperature=Room Temperature, and thin film deposition was carried out by adjusting the RF power of the In—Zn—O target and the $SiO_2$ target. For comparison of thin film characteristics according to $SiO_2$ content, the substrate holder was fixed and deposition was carried out.

Table 1 below shows the results of measuring the characteristics of the IZSO electron transport layer due to the change in $SiO_2$.

TABLE 1

|  | Mobility [cm$^2$/V · s] | carrier concentration [/cm$^3$] | Resistivity [Ωcm] | Work function [eV] | Energy bandgap [eV] |
| --- | --- | --- | --- | --- | --- |
| 3.05% | 2.2E+1 | 9.8E+19 | 3.0E−3 | 4.04 | 3.74 |
| 7.41% | 1.4E+1 | 4.6E+19 | 9.7E−3 | 4.01 | 4.14 |

TABLE 1-continued

| | Mobility [cm$^2$/V·s] | carrier concentration [/cm$^3$] | Resistivity [Ωcm] | Work function [eV] | Energy bandgap [eV] |
|---|---|---|---|---|---|
| 15.54% | 8.5E+0 | 1.4E+15 | 5.2E+2 | 3.95 | 4.38 |
| 23.62% | 3.3E+2 | 2.1E+12 | 9.2E+3 | 3.91 | 4.75 |
| 28.82% | 5.6E+2 | 2.8E+11 | 3.9E+4 | 3.89 | 4.80 |

Referring to Table 1 above, it can be seen that the mobility, carrier concentration, resistivity, work function, energy bandgap, and the like of the electron transport layer change with the change of $SiO_2$. That is, it can be seen that the conductivity of the electron transport layer can be adjusted.

Further, it can be confirmed that the characteristics of the electron transport layer required in the quantum dot light emitting diode are satisfied in the range of 3% to 29% of $SiO_2$. Further, in the previous device application experiment, $IZSO_2$ (Si 15.75 at %) showed high efficiency.

Experimental Example 2

Figure 2:
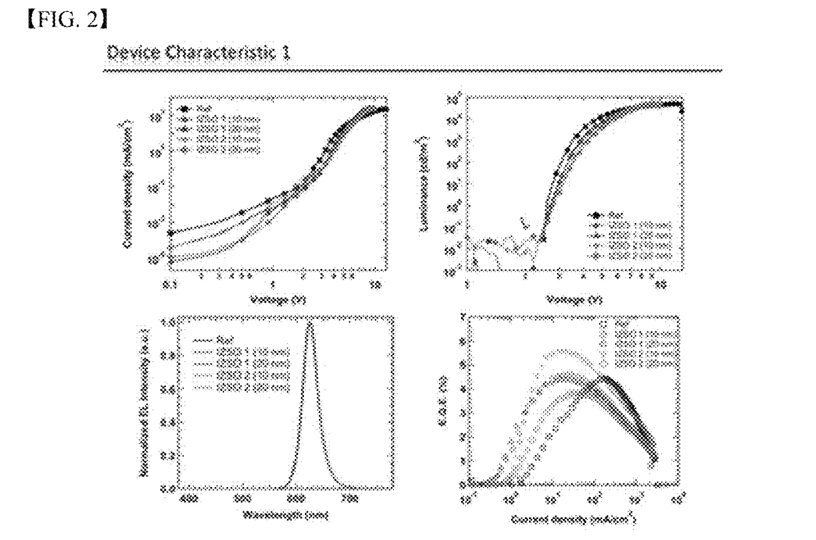
FIG. 2 is a graph of measuring characteristics of a quantum dot light emitting diode according to one embodiment of the present invention.
Figure 3:
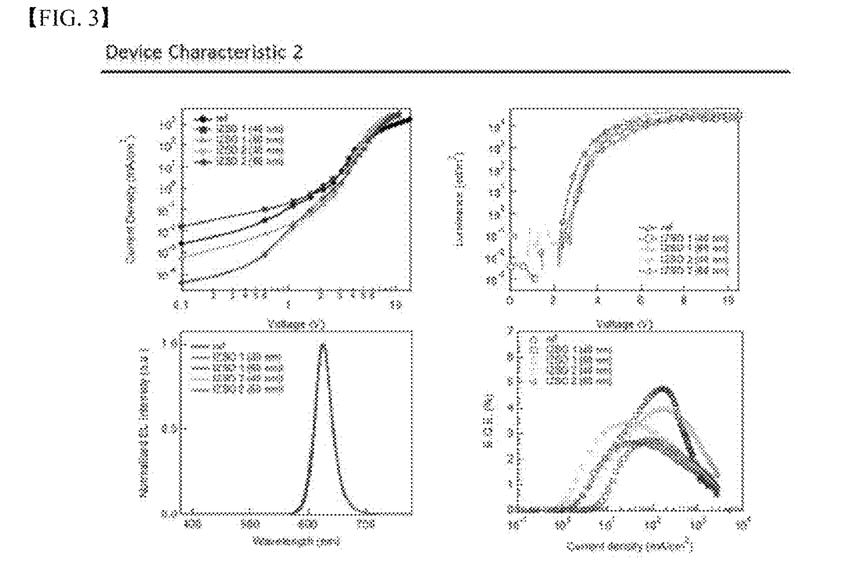
FIG. 3 is a graph of measuring characteristics of a quantum dot light emitting diode according to one embodiment of the present invention.

Measurement of Device Characteristics According to IZSO Composition and Vapor Deposition Thickness Referring to FIGS. 2 and 3, the characteristics of QLED according to the composition and deposition thickness of IZSO (In—Zn—Si—O) were observed. In FIG. 2, IZSO 1 (10 nm) is a QLED using an electron transport layer having a deposition thickness of 10 nm and a composition of Si 15.54 at %, IZSO 1 (20 nm) is a QLED using an electron transport layer having a deposition thickness of 10 nm and a composition of Si 15.54 at %, IZSO 2 (10 nm) is a QLED using an electron transport layer having a deposition thickness of 10 nm and a composition of Si 15.75 at %, and IZSO 2 (20 nm) is a QLED using an electron transport layer having a deposition thickness of 20 nm and a composition of Si 15.75 at %. At this time, the IZSO was vacuum deposited so that the resistivity was the highest, and using this, an inverted structured QLED was fabricated. On the other hand, as a control group (Ref), ZnO was solution-deposited and QLED used as an electron transport layer was used.

As a result, it can be seen that IZSO 1 (10 nm), IZSO 1 (20 nm), IZSO 2 (10 nm), and IZSO 2 (20 nm) all have lower turn-on voltage and higher EQE than the control group (Ref). This can lower the driving current and thereby reduce the power consumption, and maximize the luminous efficiency due to the increase in EQE.

Referring to FIG. 3, IZSO 1 having a composition of Si 15.54 at % and IZSO 2 having a composition of Si 15.75 at % were vacuum deposited at 40 nm and 60 nm, respectively, to fabricate an inverse structured QLEDs, and then a characteristic analysis was carried out. As a result, as the thickness increases, the resistivity decreases and the conductivity increases, so that exciton quenching at the interface becomes more active. Consequently, EQE decreased than the result of FIG. 2. In addition, it shows a phenomenon that the driving current is higher than that of the control group (ref).

Experimental Example 3

Measurement of Electron Transport Layer Characteristics According to the Oxygen Partial Pressure Adjustment of IZSO In order to compare the characteristics of the IZSO electron transport layer according to the oxygen partial pressure adjustment (Ar:O$_2$), sputtering was carried out by fixing the $SiO_2$ content (Si 10.05 at %).

Table 2 below shows the results of measuring the characteristics of the IZSO electron transport layer according to the oxygen partial pressure.

TABLE 2

| | Mobility [cm$^2$/V·s] | Carrier concentration [/cm$^3$] | Resistivity [Ωcm] |
|---|---|---|---|
| 1000:1 | 3.5E+0 | 2.8E+19 | 6.3E−2 |
| 800:1 | 1.7E+0 | 1.0E+18 | 3.6E+0 |
| 500:1 | 5.9E+0 | 1.6E+16 | 6.6E+1 |
| 250:1 | 3.7E+2 | 2.1E+11 | 8.0E+4 |

Referring to Table 2 above, it was confirmed that the mobility, carrier concentration, and resistivity of the electron transport layer could be adjusted by adjusting the oxygen partial pressure. That is, it can be seen that the conductivity of the electron transport layer can be adjusted by adjusting the oxygen partial pressure.

Experimental Example 4

Figure 4:
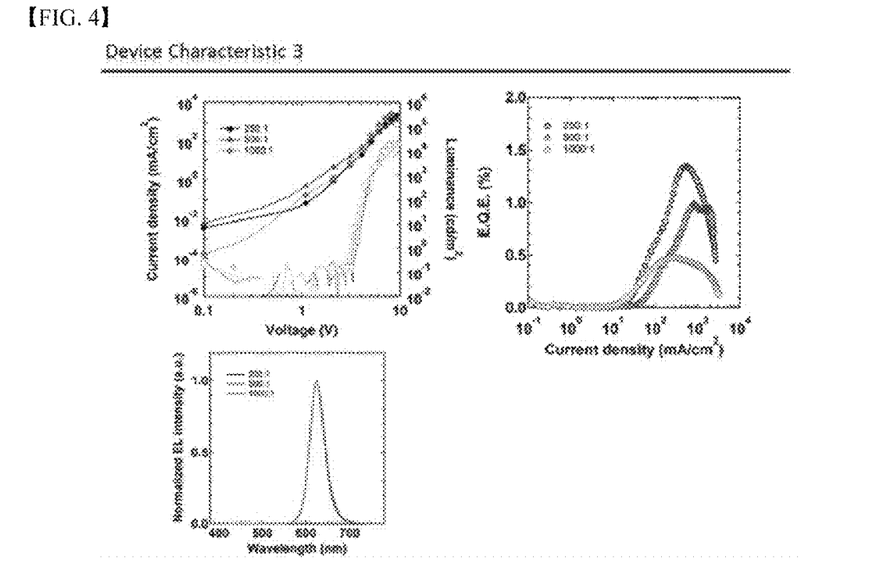
FIG. 4 is a result of evaluating the device characteristics according to the oxygen partial pressure of IZSO (Si 10.05 at %).

Measurement of Device Characteristics According to Oxygen Partial Pressure Adjustment of IZSO Referring to FIG. 4, the device characteristics according to the oxygen partial pressure of IZSO (Si 10.05 at %) were evaluated. In FIG. 4, 250:1 is a result of fabricating a QLED in which IZSO (Si 10.05 at %) adjusted to Ar:O2=250:1 was applied as an electron transport layer and then a characteristic analysis was carried out. 500:1 is a QLED in which IZSO (Si 10.05 at %) adjusted to Ar:O2=250:1 was applied as an electron transport layer, and 1000:1 relates to a QLED in which IZSO (Si 10.05 at %) adjusted to Ar:O2=1000:1 is applied as an electron transport layer. As a result, the best characteristics were shown at Ar:O2=250:1. That is, as confirmed in Experimental Example 3, the higher the oxygen partial pressure, the lower the carrier concentration. It was confirmed that QLED device characteristics were improved through low carrier concentration. That is, referring to FIG. 4, it can be confirmed that device characteristics are better at 250:1 than at 1000:1 and 500:1 which have relatively high carrier concentration.

Experimental Example 5

Measurement of Electron Transport Layer Characteristics According to ITSO Composition In order to compare the characteristics of each ITSO composition according to the $SiO_2$ content in ITSO (In—Sn—Si—O), co-sputtering was carried out using the In—Sn—O target and the $SiO_2$ target. First, it was fixed to oxygen partial pressure (O$_2$/(Ar+O$_2$))=0.001%, working pressure=10 mTorr, and substrate temperature=room temperature, and the thin film deposition was carried out by adjusting the RF power of the In—Sn—O target and the $SiO_2$ target. In order to compare the thin film characteristics according to the $SiO_2$ content, the substrate holder was fixed and vapor-deposited.

Table 3 below shows the results of measuring the characteristics of the ITSO electron transport layer according to the change in $SiO_2$.

TABLE 3

| Mobility [cm$^2$/V·s] | Carrier concentration [/cm$^3$] | Resistivity [Ωcm] | Work function [eV] | Energy bandgap [eV] |
|---|---|---|---|---|
| 14.9% | 1.7E−1 | 1.9E+20 | 1.9E−3 | 4.41 | 4.11 |
| 29.6% | 1.3E+0 | 3.0E+17 | 1.5E+1 | 4.28 | 4.45 |
| 33.0% | 3.6E+1 | 1.0E+15 | 1.6E+2 | 4.30 | 4.56 |
| 41.1% | 4.9E+2 | 5.6E+12 | 2.3E+3 | 4.24 | 4.74 |
| 53.8% | 7.6E+2 | 1.4E+12 | 5.7E+3 | 4.58 | 5.19 |

Referring to Table 3 above, it can be seen that the mobility, carrier concentration, resistivity, work function, energy bandgap, and the like of the ITSO electron transport layer change with the change of SiO$_2$. That is, it can be seen that the conductivity of the electron transport layer can be adjusted.

In addition, it can be confirmed that ITSO satisfies the characteristics of the electron transport layer required in the quantum dot light emitting diode in the range of 14% to 54% of SiO$_2$.

Experimental Example 6

Measurement of Electron Transport Layer Characteristics According to Oxygen Partial Pressure Control of ITSO In order to compare the characteristics of the metal oxide thin film according to the oxygen partial pressure control (Ar:O$_2$) of the ITSO thin film, sputtering was carried out by fixing the SiO$_2$ content (Si 33.0 at %).

Table 4 below shows the results of measuring the characteristics of the ITSO electron transport layer according to the oxygen partial pressure.

TABLE 4

| | Mobility [cm$^2$/V·s] | carrier concentration [/cm$^3$] | Resistivity [Ωcm] |
|---|---|---|---|
| 1000:1 | 7.9E−1 | 6.8E+18 | 1.2E+0 |
| 100:1 | 1.4E+2 | 1.8E+11 | 1.1E+0 |

Referring to Table 4 above, it was confirmed that the mobility, carrier concentration, and resistivity of the electron transport layer could be adjusted by adjusting the oxygen partial pressure. That is, it can be seen that the conductivity of the electron transport layer can be adjusted by adjusting the oxygen partial pressure.

Experimental Example 7

Figure 5:
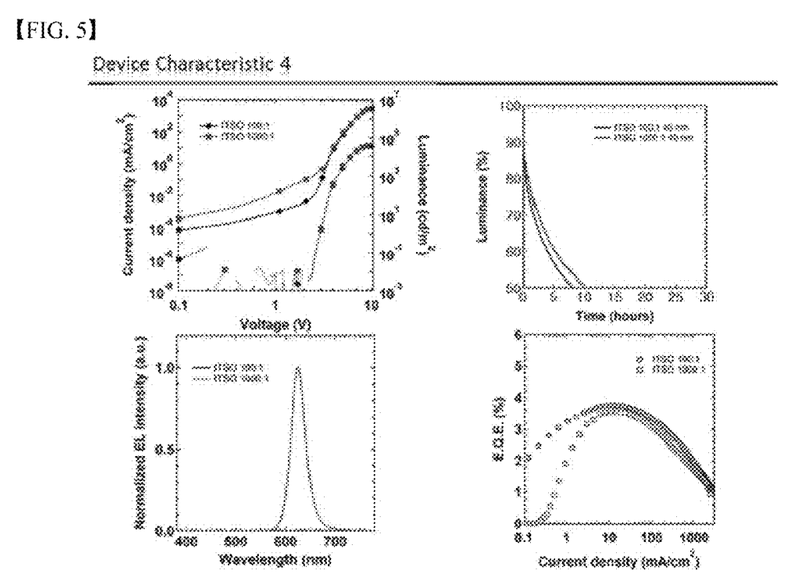
FIG. 5 is a result of evaluating the device characteristics according to the oxygen partial pressure of ITSO (Si 33.0 at %).

Measurement of Device Characteristics According to Oxygen Partial Pressure Control of ITSO Referring to FIG. 5, the device characteristics according to the oxygen partial pressure of ITSO (Si 33.0 at %) were evaluated. In FIG. 5, 100:1 is a QLED in which ITSO (Si 33.0 at %) adjusted to Ar:O$_2$=100:1 is applied as an electron transport layer, and 1000:1 relates to a QLED in which ITSO (Si 33.0 at %) adjusted to Ar:O$_2$=1000:1 is applied as an electron transport layer.

As a result, Ar:O$_2$=100:1 showed better characteristics than 1000:1. That is, as confirmed in Experimental Example 6, the higher the oxygen partial pressure, the lower the carrier concentration, and it was confirmed that the QLED device characteristics are improved through the lower carrier concentration.

The features, structures, effects, and the like described in the above embodiments are included in at least one embodiment of the present invention, and are not necessarily limited to only one embodiment. Furthermore, the features, structures, effects, and the like illustrated in each embodiment can be combined or modified with respect to other embodiments by a person having ordinary knowledge in the field to which the embodiment belongs. Therefore, the contents related to such combinations and modifications should be construed as being included in the scope of the present invention.

In addition, although the embodiments have been mainly described above, this is only an example and does not limit the present invention. Anyone with ordinary knowledge of the field to which the present invention belongs will appreciate that various modifications and applications not exemplified above can be made without departing from the essential characteristics of the present embodiment. For example, each component specifically shown in the embodiments can be modified and implemented. Further, the differences related to such modifications and applications should be construed as being included in the scope of the present invention defined in the appended claims.

The invention claimed is:
1. A light emitting diode comprising:
a first electrode and a second electrode that are opposite to each other;
a light emitting layer that is located between the first electrode and the second electrode and includes a quantum dot; and
an electron transport layer that is arranged between the first electrode and the light emitting layer and includes a metal oxide thin film,
wherein the metal oxide thin film has a composition selected from a group of chemical formulas consisting of:

[Chemical Formula 1]

wherein, in chemical formula 1, 0<x<1 and 0.03≤y<0.29, and

[Chemical Formula 2]

wherein, in chemical formula 2, 0<x<1 and 0.14≤y<0.54.
2. The light emitting diode according to claim 1, wherein: the metal oxide thin film is formed through a sputtering method.
3. A method for manufacturing a light emitting diode, comprising:
a step of forming a first electrode on a substrate; and
a step of forming an electron transport layer on the first electrode,
wherein the step of forming the electron transport layer is carried out by a sputtering method,
wherein the electron transport layer has a composition selected from a group of chemical formulas consisting of:

[Chemical Formula 1]

wherein, in chemical formula 1, 0<x<1 and 0.03≤y<0.29, and

[Chemical Formula 2]

wherein, in chemical formula 2, 0<x<1 and 0.14≤y<0.54.

4. The method for manufacturing a light emitting diode according to claim 3, wherein:
the step of forming a first electrode and the step of forming an electron transport layer are carried out by a continuous vapor deposition process through the sputtering method.

5. The method for manufacturing a light emitting diode according to claim 3, wherein:
the step of forming an electron transport layer is carried out by a sputtering method using In—Zn—O target and $SiO_2$ target.

6. The method for manufacturing a light emitting diode according to claim 3, wherein:
the step of forming an electron transport layer is carried out by a sputtering method using In—Sn—O target and $SiO_2$ target.

7. The method for manufacturing a light emitting diode according to claim 3, wherein:
the method is carried out by a single target sputtering method using any one target selected from the group consisting of an In—Zn—Si—O target, and an In—Sn—Si—O target.

8. The method for manufacturing a light emitting diode according to claim 3, wherein:
the composition ratio of $SiO_2$ is adjusted through the sputtering method in the step of forming the electron transport layer.

* * * * *